US008222970B2

(12) United States Patent
Inoue et al.

(10) Patent No.: US 8,222,970 B2
(45) Date of Patent: Jul. 17, 2012

(54) RESONANT DEVICE, COMMUNICATION MODULE, COMMUNICATION DEVICE, AND METHOD FOR MANUFACTURING RESONANT DEVICE

(75) Inventors: Kazunori Inoue, Kawasaki (JP); Tokihiro Nishihara, Kawasaki (JP); Takashi Matsuda, Kawasaki (JP); Shinji Taniguchi, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 343 days.

(21) Appl. No.: 12/503,558

(22) Filed: Jul. 15, 2009

(65) Prior Publication Data

US 2010/0013575 A1    Jan. 21, 2010

(30) Foreign Application Priority Data

Jul. 17, 2008    (JP) ................................. 2008-186175

(51) Int. Cl.
*H03H 9/54* (2006.01)
*H03H 9/70* (2006.01)
(52) U.S. Cl. ......... 333/133; 333/189; 310/324; 310/349
(58) Field of Classification Search .......... 333/187–192, 333/133; 310/365, 366, 324, 349
See application file for complete search history.

(56) References Cited

U.S. PATENT DOCUMENTS

| 6,060,818 | A | 5/2000 | Ruby et al. | |
|---|---|---|---|---|
| 6,635,519 | B2 * | 10/2003 | Barber et al. | 438/151 |
| 6,888,424 | B2 * | 5/2005 | Takeuchi et al. | 333/187 |
| 7,312,675 | B2 * | 12/2007 | Ruby et al. | 333/189 |
| 7,378,922 | B2 * | 5/2008 | Kubo et al. | 333/189 |
| 7,432,631 | B2 | 10/2008 | Taniguchi et al. | |
| 2005/0093653 | A1 | 5/2005 | Larson, III | |
| 2005/0093656 | A1 | 5/2005 | Larson, III et al. | |
| 2006/0091764 | A1 * | 5/2006 | Tsutsumi et al. | 310/324 |
| 2007/0096597 | A1 * | 5/2007 | Taniguchi et al. | 310/320 |
| 2011/0122731 | A1 * | 5/2011 | Buccafusca et al. | 367/162 |

FOREIGN PATENT DOCUMENTS

| JP | 6-40611 | B2 | 5/1994 |
|---|---|---|---|
| JP | 2000-69594 | A | 3/2000 |
| JP | 2002-217676 | * | 8/2002 |
| JP | 2005-347898 | A | 12/2005 |
| JP | 2007-510383 | A | 4/2007 |
| JP | 2007-208728 | A | 8/2007 |

OTHER PUBLICATIONS

K. Nakamura, H. Sasaki, and H. Shimizu, "ZnO/SiO$_2$-Diaphragm composite resonator on a silicon wafer", Electronics Letters, vol. 17 No. 14, pp. 507-509, Jul. 9, 1981.

* cited by examiner

*Primary Examiner* — Barbara Summons
(74) *Attorney, Agent, or Firm* — Chen Yoshimura LLP

(57) ABSTRACT

A resonant device includes first and second piezoelectric thin film resonators. The first piezoelectric thin film resonator includes a substrate, a first lower electrode formed on the substrate, a first piezoelectric film formed over the first lower electrode, and a first upper electrode formed on the piezoelectric film and opposed to the first lower electrode. The second piezoelectric thin film resonator includes a second lower electrode formed above the first upper electrode, a second piezoelectric film formed over the second lower electrode, and a second upper electrode formed on the piezoelectric film and opposed to the second lower electrode. The first membrane region in which the first lower electrode opposes to the first upper electrode through the first piezoelectric film and a second membrane region in which the second lower electrode opposes to the second upper electrode through the second piezoelectric film are laminated through a second cavity.

21 Claims, 16 Drawing Sheets

US 8,222,970 B2

RESONANT DEVICE, COMMUNICATION MODULE, COMMUNICATION DEVICE, AND METHOD FOR MANUFACTURING RESONANT DEVICE

CROSS-REFERENCE TO RELATED APPLICATIONS

This application is based upon and claims the benefit of priority of the prior Japanese Patent Application No. 2008-186175, filed on Jul. 17, 2008, the entire contents of which are incorporated herein by reference.

FIELD

The embodiments discussed herein are related to a device including a piezoelectric resonator, a communication module and a communication device that include the device, and a method for manufacturing the device.

BACKGROUND

Rapid spread of radio equipment typified by cellular phones increases the demand for small and light resonators and filters including a combination of the resonators. Hitherto, mainly, dielectric filters and surface acoustic wave (SAW) filters have been used. Nowadays, filters using piezoelectric thin film resonators are receiving attention because the piezoelectric thin film resonators are elements that achieve low-loss especially in a high frequency range, high power handling capability, and satisfactory electrostatic discharge (ESD) characteristics and can be implemented in monolithic form.

A film bulk acoustic resonator (FBAR) type resonator is known as one of such piezoelectric thin film resonators. This resonator includes a laminate that includes, as main components, a lower electrode, a piezoelectric film, and an upper electrode on a substrate. An air gap (a via hole or a cavity) is formed under a portion (a membrane region) of the lower electrode that opposes the upper electrode.

When a high frequency electrical signal is applied between the upper electrode and the lower electrode, an acoustic wave is excited in the piezoelectric film sandwiched between the upper electrode and the lower electrode by the inverse piezoelectric effect. Distortion due to the acoustic wave is converted to an electrical signal by the piezoelectric effect. Since the acoustic wave is totally reflected at a surface of each of the upper electrode and the lower electrode that is brought into contact with air, the acoustic wave is converted to a thickness extensional vibration wave having a major displacement in the thickness direction. In this structure, resonance occurs at a frequency at which a total film thickness H of a thin film structure is an integral multiple (n times) of half of the wavelength of the acoustic wave, where the thin film structure includes, as main components, the upper electrode, the piezoelectric film, and the lower electrode formed above the air gap. Assuming that V is the propagation velocity of the acoustic wave determined by the material, a resonance frequency F is:

$$F = nV/2H.$$

A resonator having desired frequency characteristics can be fabricated by controlling the resonance frequency via the film thickness H through the use of the resonance. Moreover, a filter can be fabricated by connecting a plurality of resonators.

An electrode may be made of aluminum (Al), copper (Cu), molybdenum (Mo), tungsten (W), tantalum (Ta), platinum (Pt), ruthenium (Ru), rhodium (Rh), iridium (Ir), chromium (Cr), titanium (Ti), or the like, or a laminated material composed of these materials.

Silicon, glass, gallium arsenide (GaAs), or the like may be used as a substrate. An air gap is formed by, for example, etching (wet etching or dry etching) of an Si substrate used as an element substrate from the back surface or wet etching of a sacrificial layer provided on a surface of an Si substrate. Hereinafter, a via hole refers to a hole that extends from the back surface of a substrate to the front surface of the substrate, and a cavity refers to an air gap that exists directly under a lower electrode in the neighborhood of a surface of a substrate. Known piezoelectric thin film resonators may be classified into via hole type piezoelectric thin film resonators and cavity type piezoelectric thin film resonators.

FIG. 25 is a cross sectional view illustrating the structure of an exemplary via hole type piezoelectric thin film resonator disclosed in, for example, K. Nakamura, et al, "ZnO/SiO$_2$-Diaphragm composite resonator on a silicon wafer", Electronics Letters, Vol. 17, No. 14, P.507-P.509, 1981. In this structure, Au—Cr, zinc oxide (ZnO), and aluminum (Al) are respectively formed as a lower electrode, a piezoelectric film, and an upper electrode on an (100) Si substrate that includes a thermal oxide film (SiO$_2$). A via hole 106 is formed by performing anisotropic etching on the Si substrate 101 from the back surface using a KOH aqueous solution or an EDP aqueous solution (ethylenediamine+pyrocatechol+water).

On the other hand, in a cavity type piezoelectric thin film resonator, an upper electrode, a piezoelectric film, and a lower electrode are formed as main components on a sacrificial layer, and finally, a cavity is formed by removing the sacrificial layer by etching. FIG. 26 illustrates a cross sectional view of a cavity type piezoelectric thin film resonator disclosed in Japanese Examined Patent Application Publication No. 1994-40611. In this example, an island-shaped sacrificial layer pattern of ZnO is prepared as a sacrificial layer, a structure that includes a dielectric film 205, an upper electrode 202, a piezoelectric film 204, a lower electrode, and a dielectric film 203 is prepared on the sacrificial layer, and a cavity 206 (an air bridge structure) is formed by removing the sacrificial layer using acid.

Moreover, FIG. 27 illustrates a cross sectional view of a cavity type piezoelectric thin film resonator disclosed in Japanese Laid-open Patent Publication No. 2000-69594. This structure represents a piezoelectric thin film resonator in which a depression 306 is provided in a substrate surface below a region where an upper electrode 302, a piezoelectric film 304, and a lower electrode 303 overlap with each other. In the piezoelectric thin film resonator illustrated in FIG. 27, after a sacrificial layer is deposited on the depression 306 formed in advance to flatten the substrate surface, and the upper electrode 302, the piezoelectric film 304, and the lower electrode 303 are formed. Finally, a cavity is formed by removing the sacrificial layer by etching.

As a piezoelectric film, aluminum nitride (AlN), zinc oxide (ZnO), lead zirconate titanate (PZT), lead titanate (PbTiO3), or the like may be used. In practice, in many cases, AlN is used in terms of acoustic velocity, temperature characteristics, the Q-value, and easiness of the film deposition technique. In particular, one of important factors determining the resonance characteristics is forming a highly crystalline AlN film that is c-axis (perpendicular to a lower electrode surface) oriented. This factor directly affects the coupling coefficient and the Q-value. On the other hand, when a highly crystalline AlN film that is c-axis oriented is deposited, a high energy needs to be applied. For example, in metal organic chemical vapor deposition (MOCVD), a substrate needs to be heated at a temperature of at least 1000° C. Even in plasma enhanced chemical vapor deposition (PECVD), in addition to electrical power for plasma, a substrate needs to be heated at a temperature of at least 400° C. It is known that, even when a sputtering technique is used, the temperature of a substrate is increased by sputtering of an insulator film. Thus, in general, an AlN film has a strong membrane stress.

Japanese Laid-open Patent Publication No. 2005-347898 discloses that a cavity of the order of several micrometers high can be formed even with a sacrificial layer of the order of several hundred nanometers thick by controlling the stresses of upper and lower electrodes and AlN to inflate a region (hereinafter called a membrane region) where the upper and lower electrodes and AlN overlap with each other on an air gap.

FIG. 28A is a plan view for illustrating the structure of a piezoelectric thin film resonator disclosed in the Patent Publication. FIG. 28B is a cross sectional view taken along line A-A in FIG. 28A. In this case, an Si substrate that includes a flat principal surface is used as a substrate 41. A lower electrode 43 is composed of an Ru film (260 nm thick). A piezoelectric film 44 is composed of an AlN film (1200 nm thick). An upper electrode 45 is composed of an Ru film (260 nm thick).

An cavity 46 in the shape of a domed bulge is formed between the underside of the lower electrode 43 at a membrane region where the upper electrode 45 and the lower electrode 43 oppose each other, sandwiching the piezoelectric film 44, and a surface of the substrate 41. The shape of the cavity 46 is an ellipse, as illustrated in FIG. 28A. The shape of a part where the upper electrode 45 overlaps with the lower electrode 43 is formed so as to be substantially an ellipse. The cavity 46 can be formed by removing a pre-patterned sacrificial layer (not illustrated) under the lower electrode 43. Moreover, an etching solution inlet 47a for etching a sacrificial layer so as to form an cavity is provided in the substrate 41.

FIGS. 29A to 29C are cross sectional views for illustrating the process of fabricating the piezoelectric thin film resonator illustrated in FIGS. 28A and 28B. These drawings are cross sectional views taken along line A-A in FIG. 28A.

MgO (of the order of 20 to 100 nm thick) to be formed as a sacrificial layer film 50 is first deposited on the substrate 41 composed of Si (or a quartz substrate) by a sputtering technique or a vacuum evaporation technique, as illustrated in FIG. 29A. Then, the sacrificial layer 50 is patterned into a desired shape by a photolithography technique and etching.

Then, the lower electrode 43, the piezoelectric film 44, and the upper electrode 45 are formed in sequence, as illustrated in FIG. 29B. The lower electrode 43 is deposited by sputtering in an Ar gas atmosphere under a pressure of 0.6 to 1.2 Pa. The lower electrode 43 is further patterned into a desired shape by a photolithography technique and etching. Then, AlN to be formed as the piezoelectric film 44 is deposited by sputtering, using an Al target, in an Ar/N2 gas mixture atmosphere under a pressure of about 0.3 Pa. Then, an Ru film to be formed as the upper electrode 45 is deposited by sputtering in an Ar gas atmosphere under a pressure of 0.6 to 1.2 Pa. The upper electrode 45 and the piezoelectric film 44 are patterned into desired shapes by performing a photolithography technique and etching (wet etching or dry etching) on a piezoelectric thin film resonator deposited in this manner. In this case, the stress of the piezoelectric thin film resonator, which includes the lower electrode 43, the piezoelectric film 44, and the upper electrode 45, is set so as to be compressive stress. Moreover, a central part of an extraction part of the upper electrode 45 in contact with the membrane region is formed above an cavity 40 to be formed in the next step, and both ends of the extraction part of the upper electrode 45 are formed outside the cavity 40.

Then, an etching solution inlet 49 (refer to FIG. 28A) is formed in the lower electrode 43 by a photolithography technique based on resist patterning, as illustrated in FIG. 29C. The cavity 40 is formed by removing, by etching, the sacrificial layer 50 by injecting an etching solution from the etching solution inlet 49. In this case, the stress of the piezoelectric thin film resonator, which includes the lower electrode 43, the piezoelectric film 44, and the upper electrode 45, is set so as to be compressive stress. Thus, when this condition for the stress is satisfied, upon completion of etching of the sacrificial layer 50, the piezoelectric thin film resonator is inflated, so that the dome-shaped cavity 40 is formed between the lower electrode 43 and the substrate 41. The inlet for an etching solution for the sacrificial layer 50 may be provided in a central part of the membrane region, as disclosed in Japanese Laid-open Patent Publication No. 2007-208728.

While piezoelectric thin film resonators have the aforementioned features, as the size of devices that include piezoelectric thin film resonators has been reduced, the demand for a further reduction in the size of piezoelectric thin film resonators has arisen.

In general, piezoelectric thin film resonators are arranged in a two-dimensional array to constitute a filter, as in the case of surface acoustic wave devices. Thus, the size of a substrate that constitutes a filter is determined by the area occupied by piezoelectric thin film resonators on the substrate and the wiring. In order to reduce the size of a substrate, a method for reducing the area occupied by piezoelectric thin film resonators on a substrate surface by stacking the resonators may be considered. In Japanese Laid-open Patent Publication No. 2007-510383, a decoupled stacked bulk acoustic resonator band-pass filter is disclosed as such a stacked resonator. An upper film bulk acoustic resonator 120 is stacked on a lower film bulk acoustic resonator 110 with an acoustic decoupling material 130 therebetween, as illustrated in FIG. 5B in the Patent Publication.

This structure solves, by providing an acoustic decoupling material between upper and lower film bulk acoustic resonators, the problem of excessive coupling between the upper and lower film bulk acoustic resonators in a simply stacked thin-film bulk acoustic resonator (SBAR) illustrated in FIG. 3 in the Patent Publication.

SUMMARY

According to an aspect of the invention, a resonant device includes first and second piezoelectric thin film resonators. The first piezoelectric thin film resonator includes a substrate, a first lower electrode formed on the substrate, a first piezoelectric film formed over the first lower electrode, and a first upper electrode formed on the piezoelectric film and opposed to the first lower electrode. The second piezoelectric thin film resonator includes a second lower electrode formed above the first upper electrode, a second piezoelectric film formed over the second lower electrode, and a second upper electrode formed on the piezoelectric film and opposed to the second lower electrode. The first membrane region in which the first lower electrode opposes to the first upper electrode through the first piezoelectric film and a second membrane region in which the second lower electrode opposes to the second upper electrode through the second piezoelectric film are laminated through a second cavity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

1. Structure of Resonant Device

First Embodiment

Figure 1:
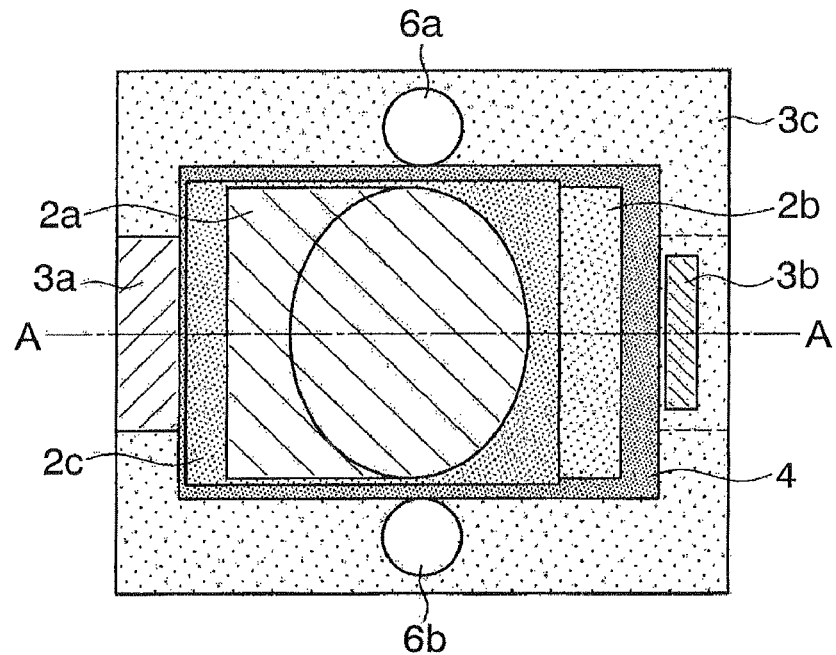
FIG. 1 is a plan view of an example of a piezoelectric thin film resonator according to the first embodiment.
Figure 2:
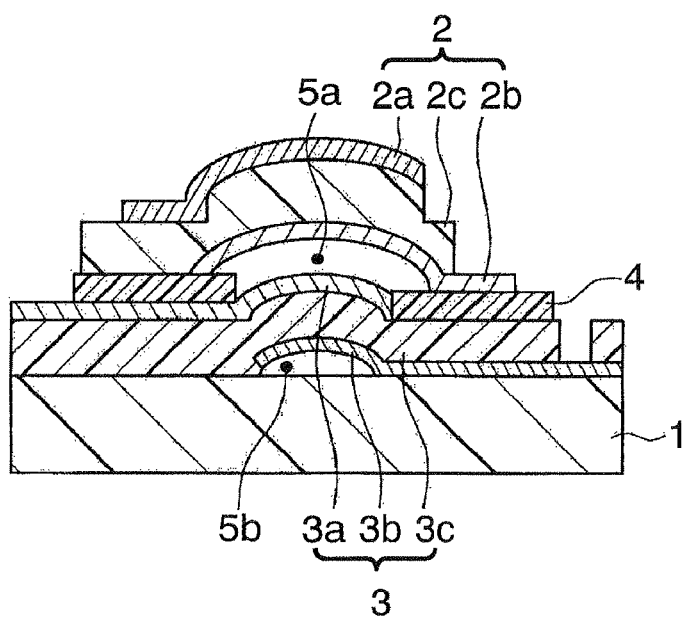
FIG. 2 is a cross sectional view taken along line A-A in FIG. 1.

FIG. 1 is a top view illustrating the structure of a resonant device according to an embodiment. FIG. 2 is a cross sectional view taken along line A-A in FIG. 1.

A substrate 1 is composed of an Si substrate that includes a flat principal surface, as illustrated in FIG. 1. A first piezoelectric thin film resonator 3 constructed by laminating an upper electrode 3a, a lower electrode 3b, and a piezoelectric film 3c is provided on the substrate 1. Moreover, a second piezoelectric thin film resonator 2 constructed by laminating an upper electrode 2a, a lower electrode 2b, and a piezoelectric film 2c is provided above the first piezoelectric thin film resonator 3, with an insulator film 4 being sandwiched between the second piezoelectric thin film resonator 2 and the first piezoelectric thin film resonator 3. Each of the lower electrodes 2b and 3b is composed of an Ru film. Each of the piezoelectric films 2c and 3c is composed of an AlN film. Each of the upper electrodes 2a and 3a is composed of an Ru film.

A cavity 5a in the shape of a domed bulge is formed between the underside of the lower electrode 2b at a membrane region where the upper electrode 2a and the lower electrode 2b oppose each other, sandwiching the piezoelectric film 2c, and a surface of the upper electrode 3a of the first piezoelectric thin film resonator 3. Moreover, a cavity 5b in the shape of a domed bulge is formed between the underside of the lower electrode 3b at a membrane region where the upper electrode 3a and the lower electrode 3b oppose each other, sandwiching the piezoelectric film 3c, and a surface of the substrate 1. The each shape of the cavities 5a and 5b is an ellipse, as viewed from the top, as illustrated in FIG. 1. The shape of a region where the upper electrodes 2a and 3a and the lower electrodes 2b and 3b overlap with each other is formed so as to be substantially an ellipse. Moreover, the membrane region of the second piezoelectric thin film resonator 2 is physically separated from the membrane region of the first piezoelectric thin film resonator 3 by the cavity 5a. The cavities 5a and 5b can be formed by, in advance, preparing the patterns of sacrificial layers (not illustrated) under the lower electrodes 2b and 3b when the resonant device is fabricated and removing the sacrificial layers after the fabrication.

Moreover, etching solution inlets 6a and 6b for etching sacrificial layers so as to form the cavities 5a and 5b are formed in the substrate 1, as illustrated in FIG. 1.

A method for fabricating the resonant device according to the embodiment will now be described.

FIGS. 3A to 8 illustrate the process of fabricating the resonant device according to the embodiment. FIGS. 3A, 4A, 5A, 6A, and 7A are top views. FIGS. 3B, 4B, 5B, 6B, and 7B are cross sectional views taken along line A-A in the top views.

Figure 3A:
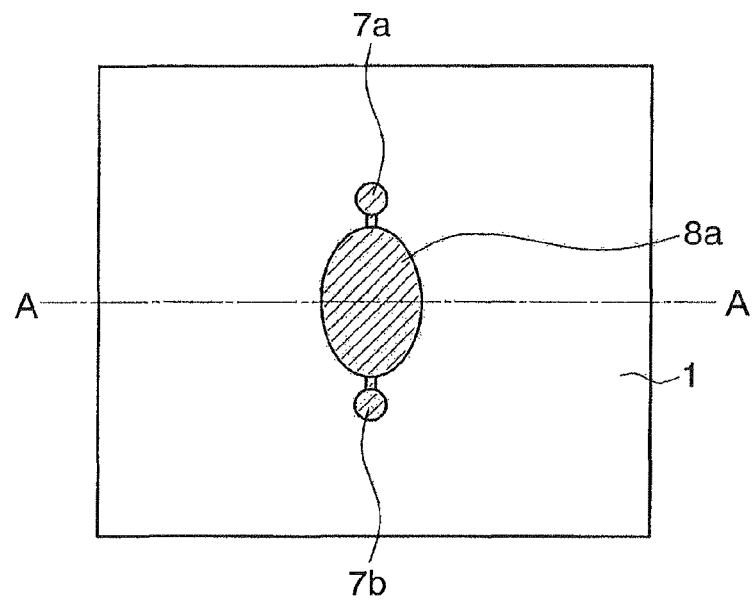
FIG. 3A is a plan view of a diagram depicting a process of fabricating the piezoelectric thin film resonator and FIG. 3B is a cross sectional view taken along line A-A in FIG. 3A.
Figure 3B:
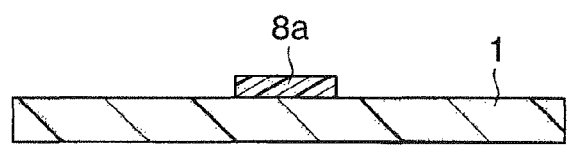

MgO (of the order of 20 to 100 nm) to be formed as a sacrificial layer film 8a is first deposited on the substrate 1 composed of silicon (Si) (or a quartz substrate) by a sputtering technique or a vacuum evaporation technique, as illustrated in FIGS. 3A and 3B. Then, the sacrificial layer 8a is patterned into a desired shape by a photolithography technique and etching. At this time, sacrificial layer etching solution inlet patterns 7a and 7b for forming cavities are formed.

Figure 4A:
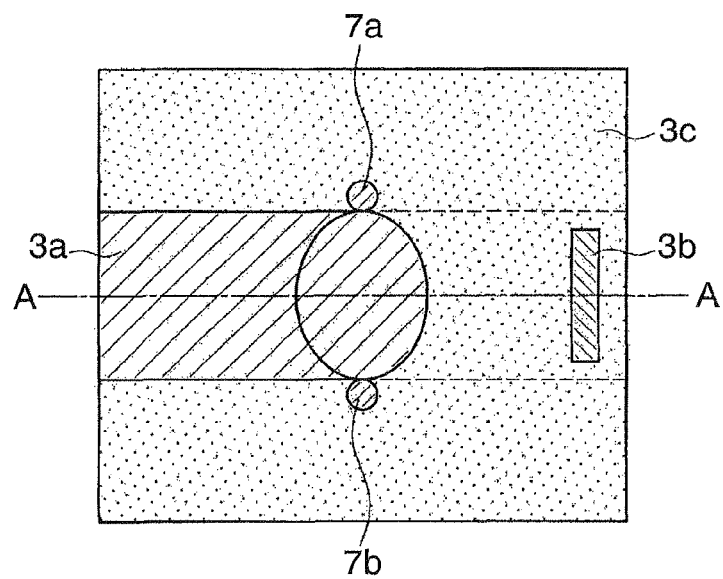
FIG. 4A is a plan view of a diagram depicting a process of fabricating the piezoelectric thin film resonator and FIG. 4B is a cross sectional view taken along line A-A in FIG. 4A.
Figure 4B:
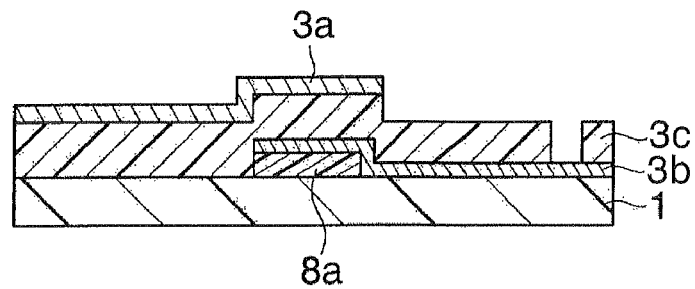

Then, the lower electrode 3b, the piezoelectric film 3c, and the upper electrode 3a are formed on the substrate 1 in sequence, as illustrated in FIGS. 4A and 4B. The lower electrode 3b is deposited by sputtering in an Ar gas atmosphere under a pressure of 0.6 to 1.2 Pa. The lower electrode 3b is further patterned into a desired shape by a photolithography technique and etching. Then, AlN to be formed as the piezoelectric film 3c is deposited by sputtering, using an Al target, in an Ar/N2 gas mixture atmosphere under a pressure of about 0.3 Pa. Then, an Ru film to be formed as the upper electrode 3a is deposited by sputtering in an Ar gas atmosphere under a pressure of 0.6 to 1.2 Pa. The upper electrode 3a and the piezoelectric film 3c are patterned into desired shapes by performing a photolithography technique and etching (wet etching or dry etching) on a piezoelectric thin film resonator deposited in this manner. In this case, the stress of the first piezoelectric thin film resonator 3, which includes the lower electrode 3b, the piezoelectric film 3c, and the upper electrode 3a, is set so as to be compressive stress.

The first piezoelectric thin film resonator 3 can be formed in the aforementioned manner.

Figure 5A:
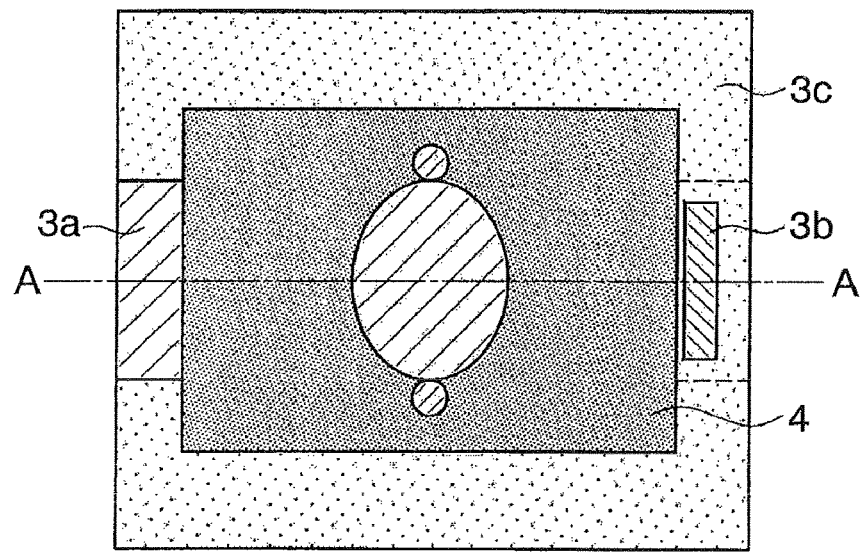
FIG. 5A is a plan view of a diagram depicting a process of fabricating the piezoelectric thin film resonator and FIG. 5B is a cross sectional view taken along line A-A in FIG. 5A.
Figure 5B:
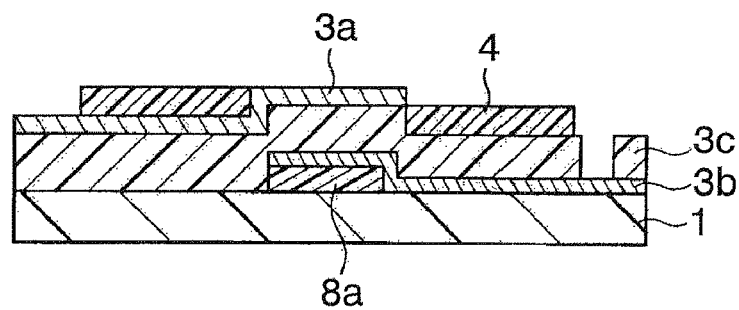

Then, after the insulator film 4 ($SiO_2$) is deposited by a technique such as a plasma CVD technique or a sputtering technique, without removing the sacrificial layer 8a and the inlet patterns 7a and 7b, patterning is performed by dry etching, as illustrated in FIGS. 5A and 5B.

Figure 6A:
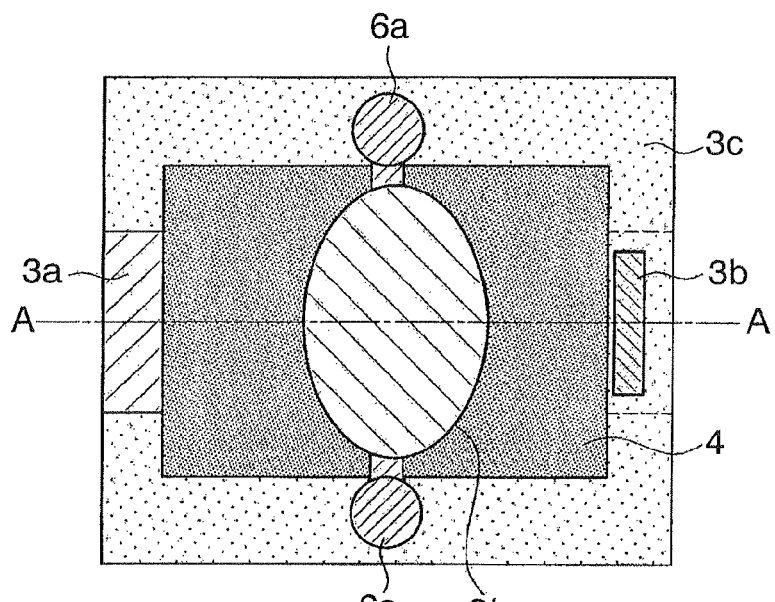
FIG. 6A is a plan view of a diagram depicting a process of fabricating the piezoelectric thin film resonator and FIG. 6B is a cross sectional view taken along line A-A in FIG. 6A.
Figure 6B:
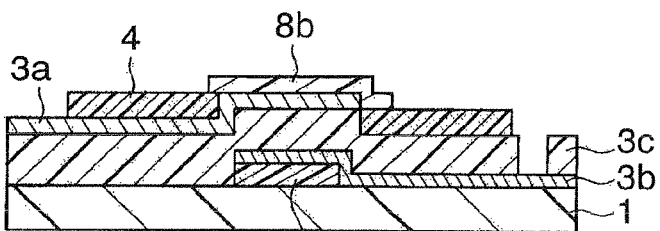

Then, a sacrificial layer 8b is formed on the upper electrode 3a and the insulator film 4, as illustrated in FIGS. 6A and 6B. The method for forming the sacrificial layer 8b is similar to the method for forming the sacrificial layer 8a.

Figure 7A:
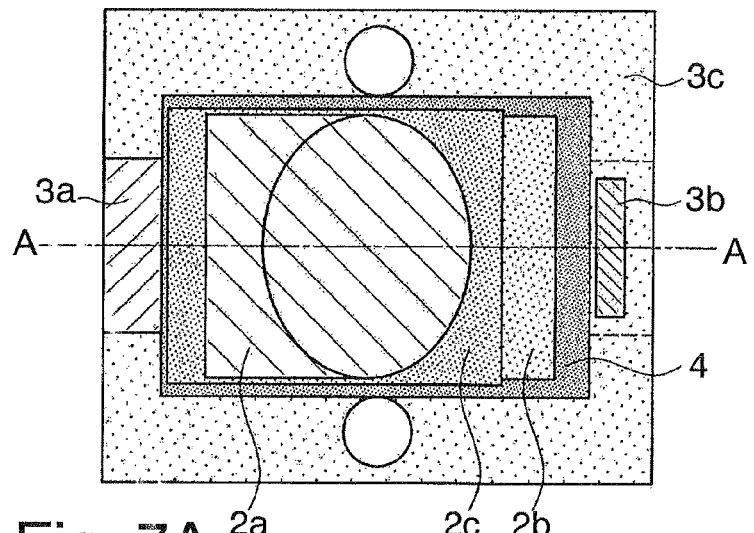
FIG. 7A is a plan view of a diagram depicting a process of fabricating the piezoelectric thin film resonator and FIG. 7B is a cross sectional view taken along line A-A in FIG. 7A.
Figure 7B:
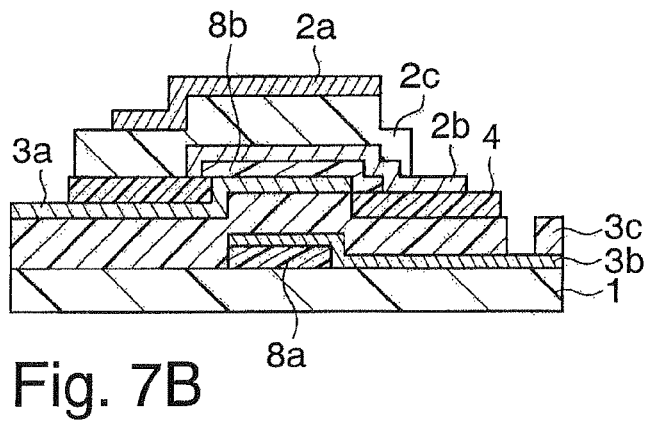

Then, the lower electrode 2b, the piezoelectric film 2c, and the upper electrode 2a are formed on the insulator film 4 and the sacrificial layer 8b, as illustrated in FIGS. 7A and 7B. The methods for forming the upper electrode 2a, the lower electrode 2b, and the piezoelectric film 2c are similar to the methods for forming the upper electrode 3a, the lower electrode 3b, and the piezoelectric film 3c.

Figure 8:
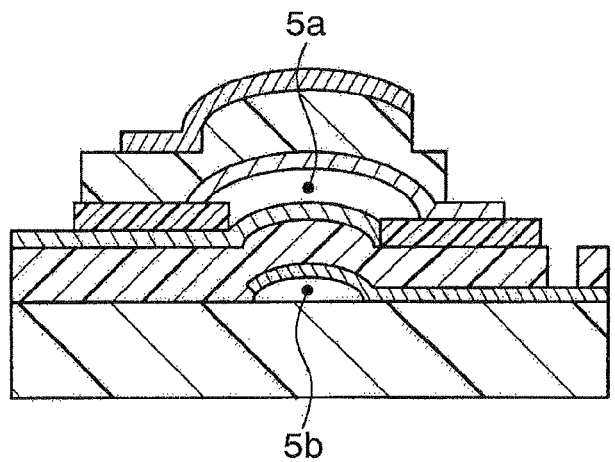
FIG. 8 is a diagram depicting a structure of the piezoelectric thin film resonator according the embodiment.

Then, the cavities 5a and 5b are formed by removing the sacrificial layers 8a and 8b by injecting, from the inlets 6a and 6b (refer to FIG. 1) formed to form cavities, an etching solution for removing sacrificial layers, as illustrated in FIG. 8. The procedure for removing the sacrificial layers 8a and 8b is as follows. The membrane region on the side of the second piezoelectric thin film resonator 2 is first inflated by removing the sacrificial layer 8b, and then the membrane region on the side of the first piezoelectric thin film resonator 3 is inflated by removing the sacrificial layer 8a. When the sacrificial layers are removed in this order, it is unlikely that the membrane region on the side of the second piezoelectric thin film resonator 2 is brought into contact with the membrane region on the side of the first piezoelectric thin film resonator 3.

Moreover, by adjusting the size of each of the membrane region on the side of the second piezoelectric thin film resonator 2 and the membrane region on the side of the first piezoelectric thin film resonator 3, it is possible that the membrane regions are not brought into contact with each other after the membrane region on the side of the second piezoelectric thin film resonator 2 and the membrane region on the side of the first piezoelectric thin film resonator 3 are inflated. Specifically, the area of the upper electrode, the lower electrode, the piezoelectric film, and the sacrificial layer corresponding to the membrane region is adjusted in each of the second piezoelectric thin film resonator 2 and the first piezoelectric thin film resonator 3. In general, the larger the membrane region is, the larger the inflation is. Thus, it is preferable that the sacrificial layer 8b be formed so as to be larger than the sacrificial layer 8a.

In this case, the respective areas of the membrane region and the upper electrode and the like that constitute the membrane region represent the respective areas of individual regions when the resonant device is viewed from the top, as illustrated in FIG. 1. Thus, the cavity 5a may be formed so as to be larger than the cavity 5b, as illustrated in FIG. 1B, by setting the area of the sacrificial layer 8b, as viewed from the top, as illustrated in FIG. 6A, so that the area of the sacrificial layer 8b is larger than the area of the sacrificial layer 8a, as viewed from the top, as illustrated in FIG. 3A.

In the embodiment, the second piezoelectric thin film resonator 2 and the first piezoelectric thin film resonator 3 constitute a stacked structure, so that the area occupied by the piezoelectric thin film resonators on the substrate 1 may be reduced. Thus, the total size of the resonant device may be reduced.

Moreover, since the cavity 5a is provided between the second piezoelectric thin film resonator 2 and the first piezoelectric thin film resonator 3, the second piezoelectric thin film resonator 2 and the first piezoelectric thin film resonator 3 are not physically coupled with each other at the membrane regions. Thus, It may be prevented to occur interference between the vibration of the second piezoelectric thin film resonator 2 and the vibration of the first piezoelectric thin film resonator 3.

Second Embodiment

Electrical insulation with the insulator film 4 illustrated in FIG. 1 is unnecessary when the stacked piezoelectric thin film resonators are connected in parallel with each other. In this case, a structure illustrated in FIGS. 9A and 9B may be adopted. Specifically, when a first piezoelectric thin film resonator 13 and a second piezoelectric thin film resonator 12 are connected in parallel with each other, as illustrated in a circuit diagram in FIG. 9C, a portion of an upper electrode 12a of the second piezoelectric thin film resonator 12 is connected to a lower electrode 13b of the first piezoelectric thin film resonator 13, as illustrated in FIG. 9B. Moreover, a portion of a lower electrode 12b of the second piezoelectric thin film resonator 12 is connected to an upper electrode 13a of the first piezoelectric thin film resonator 13. Even in the case of this structure, the cavity 5a is formed between the second piezoelectric thin film resonator 12 and the first piezoelectric thin film resonator 13, and the cavity 5b is formed between the first piezoelectric thin film resonator 13 and the substrate 1.

Figure 9A:
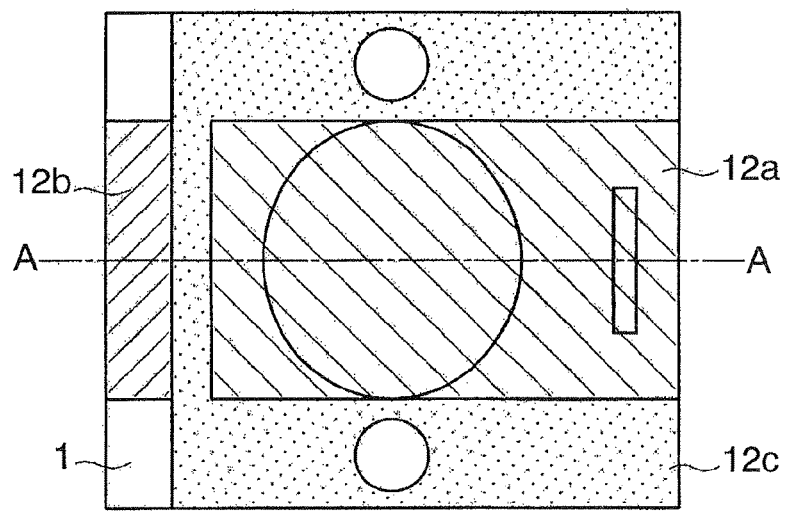
FIG. 9A is a plan view of an example of a piezoelectric thin film resonator according to the second embodiment.
Figure 9B:
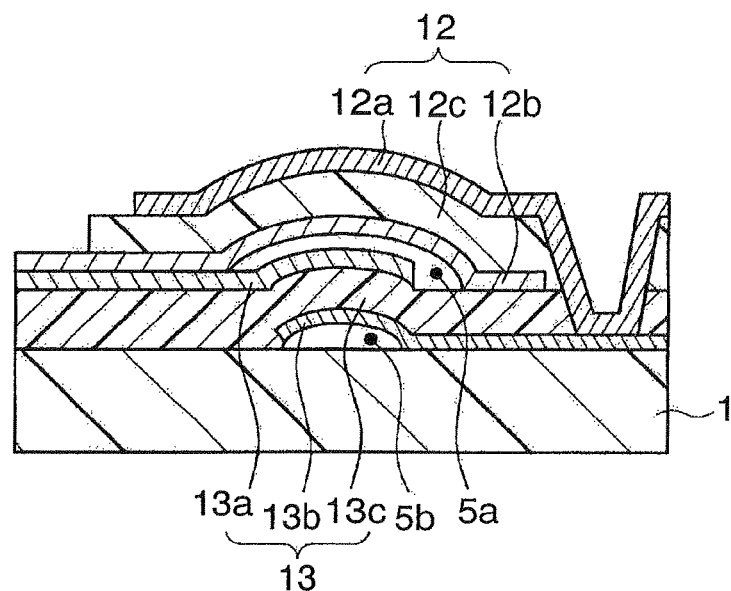
FIG. 9B is a cross sectional view taken along line A-A in FIG. 9A.
Figure 9C:
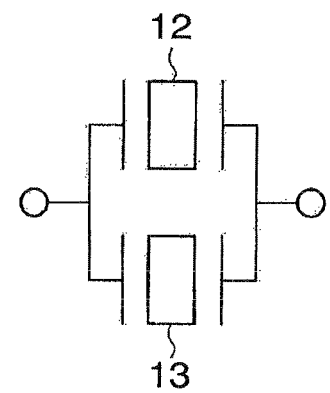
FIG. 9C is a circuit diagram depicting two piezoelectric thin film resonator connected in parallel with each other.
Figure 10A:
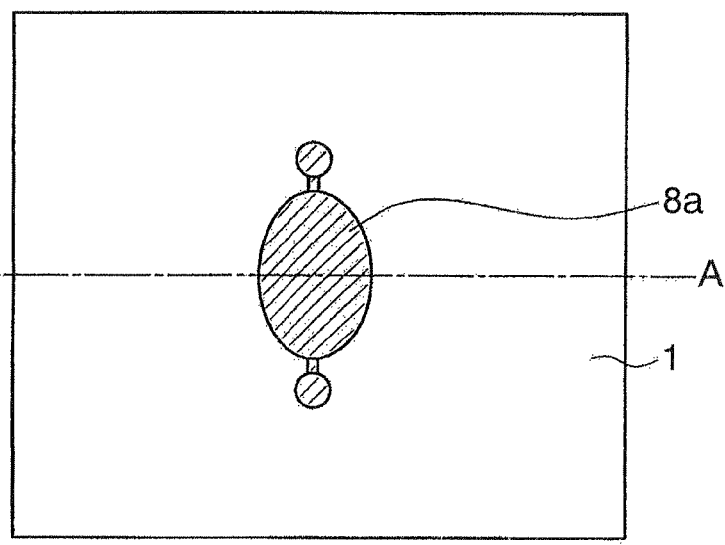
FIG. 10A is a plan view of a diagram depicting a process of fabricating the piezoelectric thin film resonator according to the second embodiment and FIG. 10B is a cross sectional view taken along line A-A in FIG. 10A.
Figure 10B:
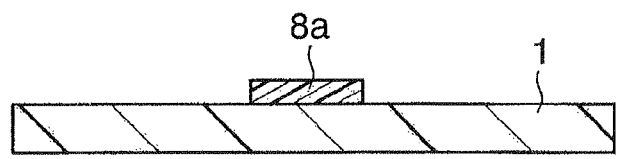
Figure 11A:
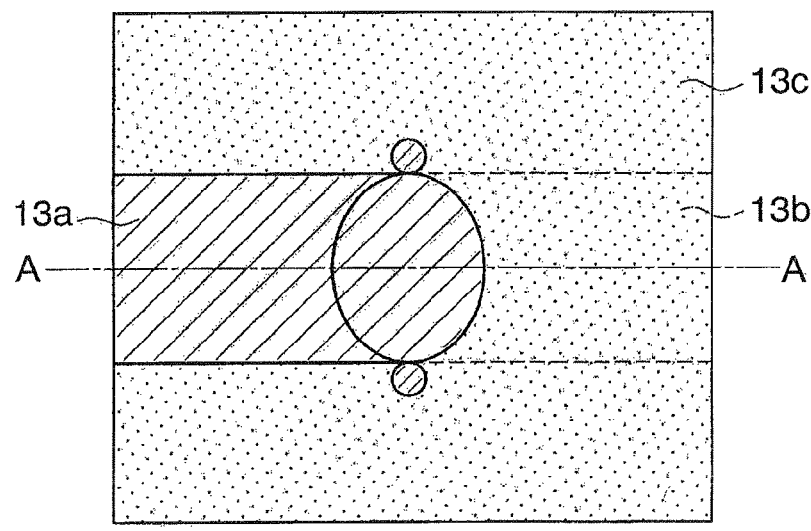
FIG. 11A is a plan view of a diagram depicting a process of fabricating the piezoelectric thin film resonator according to the second embodiment and FIG. 11B is a cross sectional view taken along line A-A in FIG. 11A.
Figure 11B:
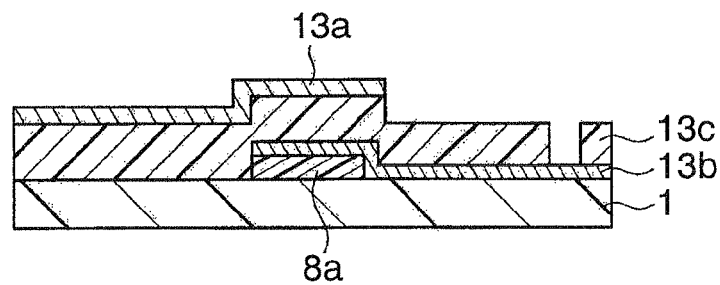
Figure 12A:
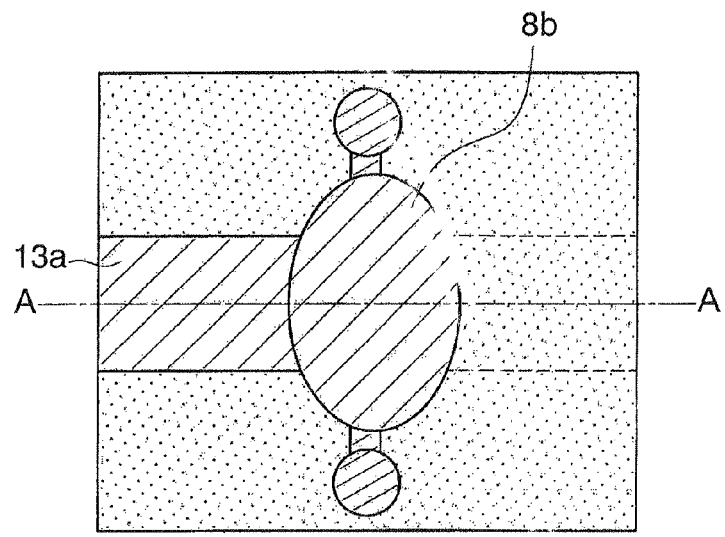
FIG. 12A is a plan view of a diagram depicting a process of fabricating the piezoelectric thin film resonator according to the second embodiment and FIG. 12B is a cross sectional view taken along line A-A in FIG. 12A.
Figure 12B:
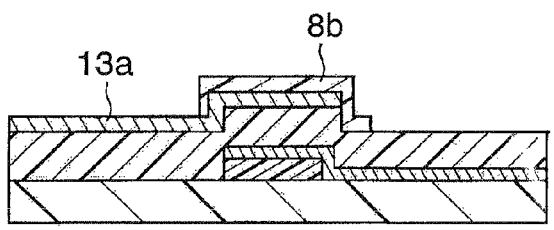
Figure 13A:
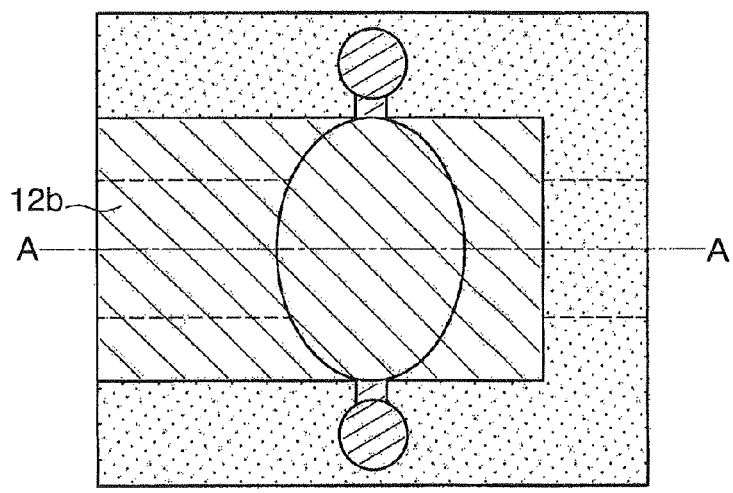
FIG. 13A is a plan view of a diagram depicting a process of fabricating the piezoelectric thin film resonator according to the second embodiment and FIG. 13B is a cross sectional view taken along line A-A in FIG. 13A.
Figure 13B:
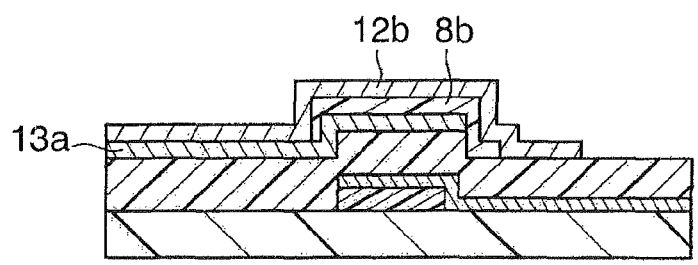
Figure 14A:
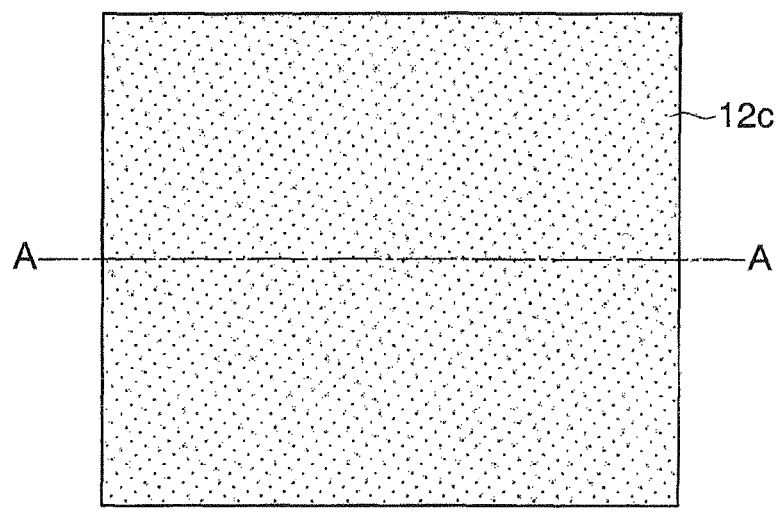
FIG. 14A is a plan view of a diagram depicting a process of fabricating the piezoelectric thin film resonator according to the second embodiment and FIG. 14B is a cross sectional view taken along line A-A in FIG. 14A.
Figure 14B:
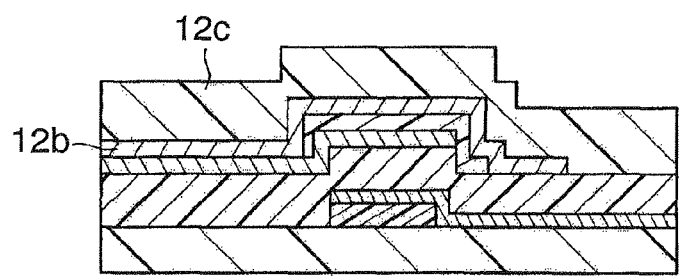
Figure 15A:
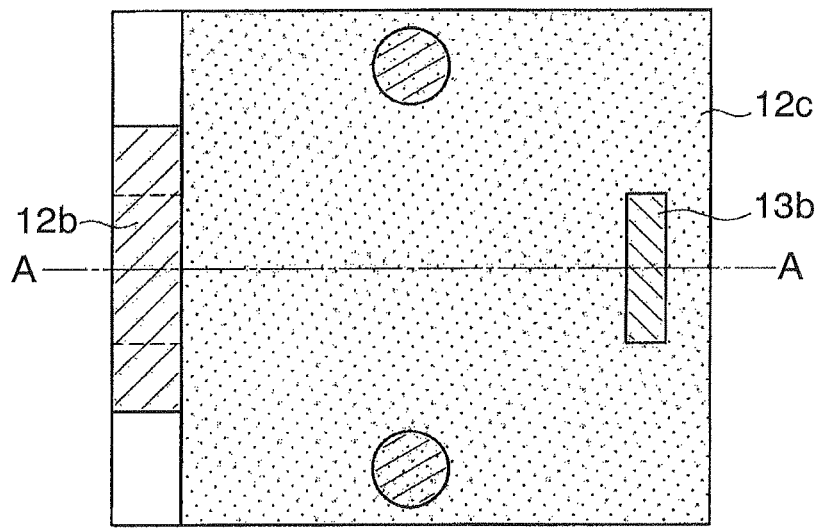
FIG. 15A is a plan view of a diagram depicting a process of fabricating the piezoelectric thin film resonator according to the second embodiment and FIG. 15B is a cross sectional view taken along line A-A in FIG. 15A.
Figure 15B:
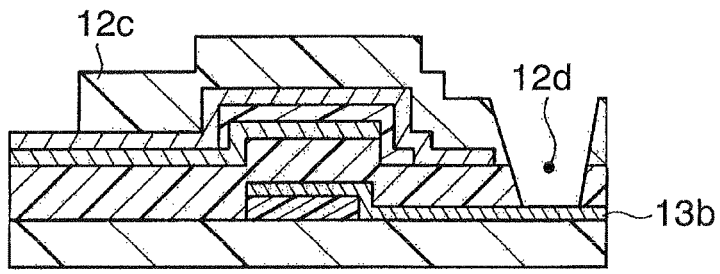
Figure 16A:
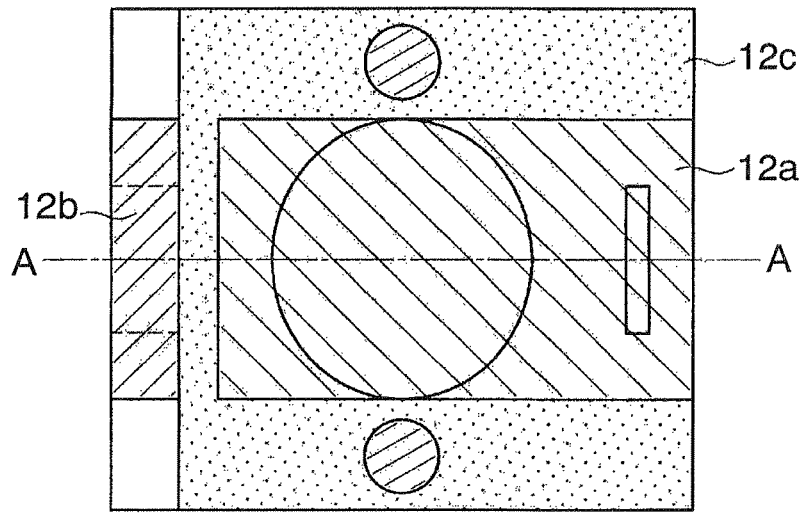
FIG. 16A is a plan view of a diagram depicting a process of fabricating the piezoelectric thin film resonator according to the second embodiment and FIG. 16B is a cross sectional view taken along line A-A in FIG. 16A.
Figure 16B:
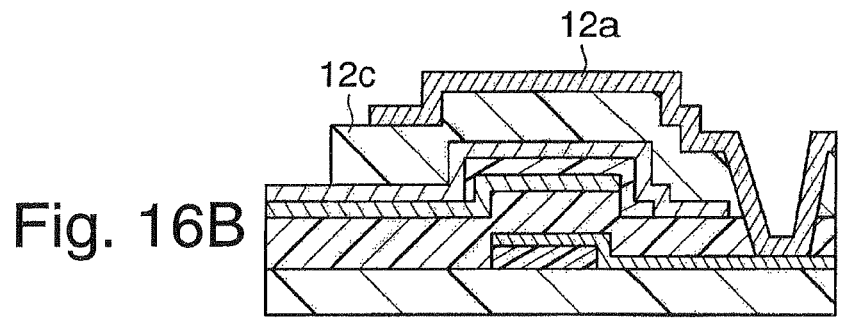
Figure 17:
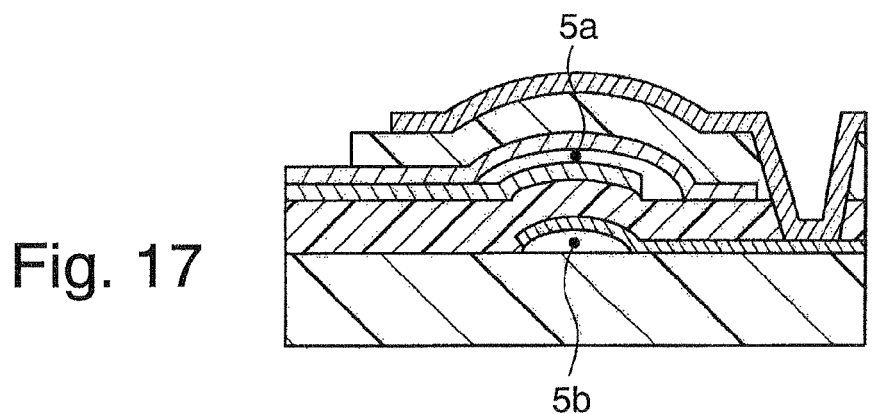
FIG. 17 is a cross sectional view of a diagram depicting a process of fabricating the piezoelectric thin film resonator according to the second embodiment.

A method for fabricating a resonant device illustrated in FIGS. 9A and 9B is as illustrated in FIGS. 10A to 17. The sacrificial layer 8a is first formed on the substrate 1, as illustrated in FIGS. 10A and 10B. Then, the first piezoelectric thin film resonator 13 is formed on the substrate 1 and the sacrificial layer 8a, as illustrated in FIGS. 11A and 11B. Then, the sacrificial layer 8b is formed on the upper electrode 13a of the first piezoelectric thin film resonator 13, as illustrated in FIGS. 12A and 12B. Then, the lower electrode 12b of the second piezoelectric thin film resonator 12 is formed, as illustrated in FIGS. 13A and 13B. Then, a piezoelectric film 12c is formed, as illustrated in FIGS. 14A and 14B. Then, patterning is performed on the piezoelectric film 12c to form a depression 12d where the lower electrode 13b is exposed, as illustrated in FIGS. 15A and 15B. Then, the upper electrode 12a is formed, as illustrated in FIGS. 16A and 16B. Then, the cavities 5a and 5b are formed by removing the sacrificial layers 8a and 8b, as illustrated in FIG. 17. In this manner, the resonant device in which the second piezoelectric thin film resonator 12 and the first piezoelectric thin film resonator 13 are connected in parallel with each other may be fabricated.

When such a structure is adopted, the advantage of being capable of eliminating a forming step and a patterning step for an insulator film may be achieved because no insulator film needs to be formed between the second piezoelectric thin film resonator 12 and the first piezoelectric thin film resonator 13.

Moreover, even in this structure, the second piezoelectric thin film resonator 12 and the first piezoelectric thin film resonator 13 constitute a stacked structure. Thus, since the area occupied by the piezoelectric thin film resonators on the substrate may be reduced, the size of the resonant device may be reduced.

Moreover, since the membrane region of the second piezoelectric thin film resonator 12 is physically separated from the membrane region of the first piezoelectric thin film resonator 13, interference between the vibration of the second piezoelectric thin film resonator 12 and the vibration of the first piezoelectric thin film resonator 13 may be prevented from occurring.

Third Embodiment

Figure 18A:
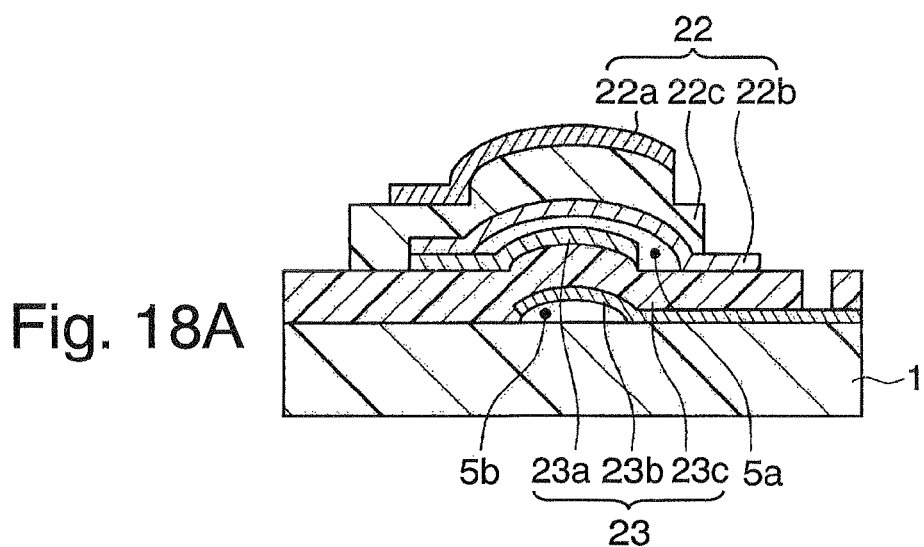
FIG. 18A is a cross sectional view of an example of a piezoelectric thin film resonator according to the third embodiment and FIG. 18B is a circuit diagram depicting two piezoelectric thin film resonator connected in series with each other.
Figure 18B:
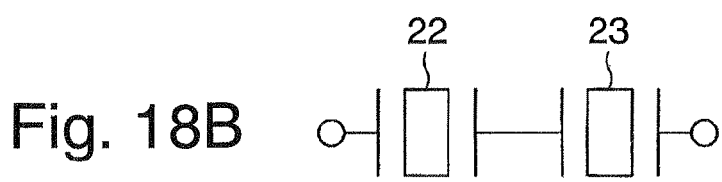

In a structure illustrated in FIG. 18A, a second piezoelectric thin film resonator 22 and a first piezoelectric thin film resonator 23 are connected in series with each other. Specifically, when the second piezoelectric thin film resonator 22 and the first piezoelectric thin film resonator 23 are connected in series with each other, as illustrated in FIG. 18B, a lower electrode 22b of the second piezoelectric thin film resonator 22 is electrically connected to an upper electrode 23a of the first piezoelectric thin film resonator 23, as illustrated in FIG. 18A. In this case, since a method for fabricating a resonant device according to this embodiment is substantially the same as the fabrication method illustrated in the first embodiment (except for the presence or absence of the insulator film 4), the description is omitted.

When such a structure is adopted, the advantage of being capable of eliminating a forming step and a patterning step for an insulator film may be achieved because no insulator film needs to be formed between the second piezoelectric thin film resonator 22 and the first piezoelectric thin film resonator 23.

Moreover, even in this structure, the second piezoelectric thin film resonator 22 and the first piezoelectric thin film resonator 23 constitute a stacked structure. Thus, since the area occupied by the piezoelectric thin film resonators on the substrate may be reduced, the size of the resonant device may be reduced.

Moreover, since the membrane region of the second piezoelectric thin film resonator 22 is physically separated from the membrane region of the first piezoelectric thin film resonator 23, interference between the vibration of the second piezoelectric thin film resonator 22 and the vibration of the first piezoelectric thin film resonator 23 may be prevented from occurring.

Fourth Embodiment

Figure 19:
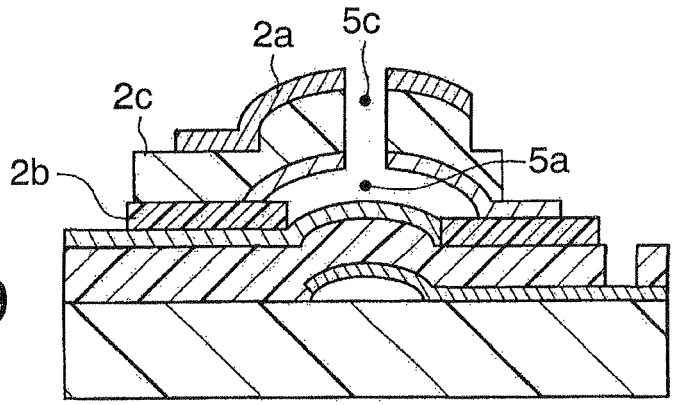
FIG. 19 is a cross sectional view of an example of a piezoelectric thin film resonator according to an embodiment.

FIG. 19 illustrates a structure in which a membrane region in a piezoelectric thin film resonator includes an aperture or an opening. A resonant device illustrated in FIG. 19 has a structure in which an etching inlet 5c is formed in the membrane region of the second piezoelectric thin film resonator 2 in the resonant device illustrated in FIG. 2. When such a structure is adopted, at the time of fabricating the resonant device, in a step of removing a sacrificial layer, a sacrificial layer provided in the cavity 5a is quickly removed. Thus, the sacrificial layer provided in the cavity 5a may be reliably removed.

Figure 20:
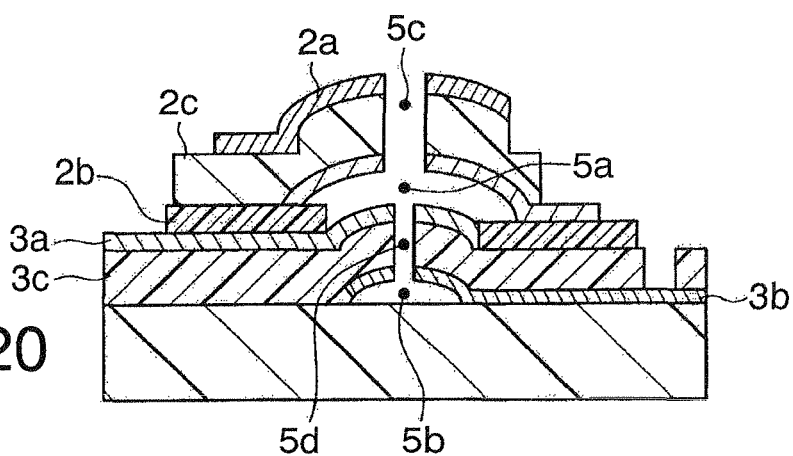
FIG. 20 is a cross sectional view of an example of a piezoelectric thin film resonator according to an embodiment.

FIG. 20 illustrates a structure in which the etching inlet 5c is formed in the membrane region of the second piezoelectric thin film resonator 2, and an etching inlet 5d is formed in the membrane region of the first piezoelectric thin film resonator 3. The etching inlets 5c and 5d are formed at positions that overlap with each other. Moreover, it is preferable that the inside diameter of the etching inlet 5c be larger than the inside diameter of the etching inlet 5d, as in this embodiment, because a sacrificial layer in the cavity 5a is quickly removed.

Figure 21:
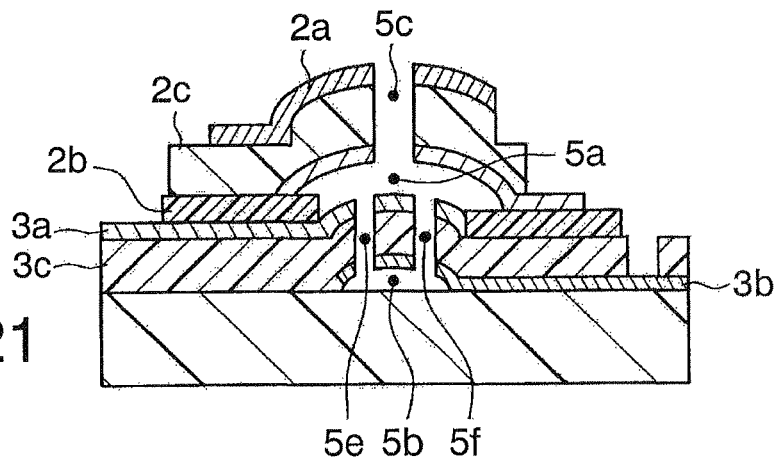
FIG. 21 is a cross sectional view of an example of a piezoelectric thin film resonator according to an embodiment.

FIG. 21 illustrates a structure in which etching inlets 5e and 5f formed in the membrane region of the first piezoelectric thin film resonator 3 are provided so as to be shifted, in the plane direction of the substrate 1, with respect to the etching inlet 5c formed in the membrane region of the second piezoelectric thin film resonator 2.

In this case, the number of apertures of etching inlets may be more than one and may be adjusted in a manner that depends on etching conditions and the order of the size of the inflation of a membrane region.

2. Structure of Duplexer

Duplexers are included in mobile communication (high-frequency radio communication) such as cellular phone units, personal handy-phone system (PHS) units, and wireless LAN systems. Duplexers have functions of transmitting and receiving, for example, radio waves for communication and are used in radio equipment in which the frequency of transmit signals differs from the frequency of receive signals.

Figure 22:
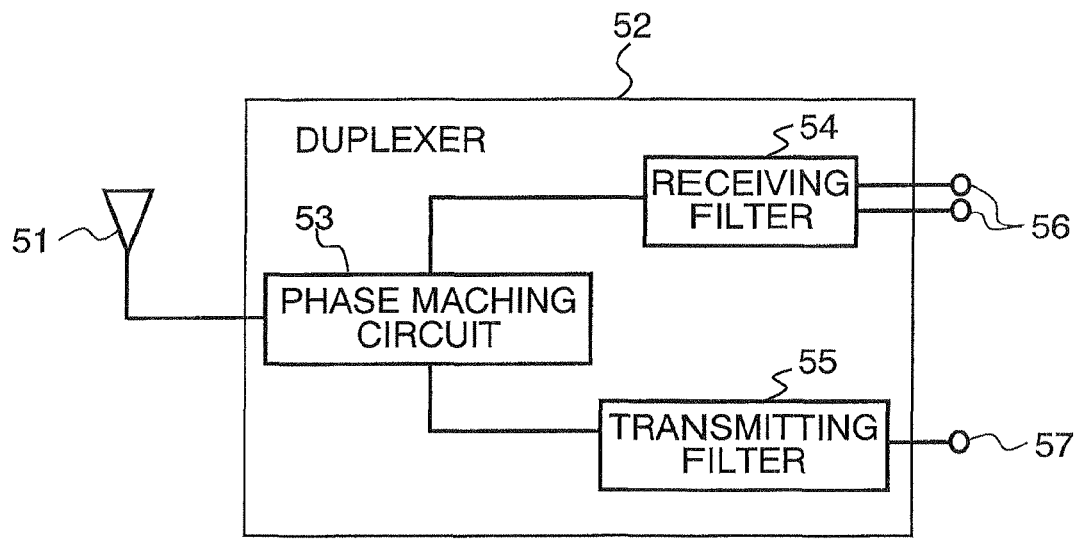
FIG. 22 is a diagram depicting an example of a duplexer according to an embodiment.

FIG. 22 illustrates the structure of a duplexer that includes the resonant devices according to the embodiments. A duplexer 52 includes a phase matching circuit 53, a receive filter 54, and a transmit filter 55. The phase matching circuit 53 is an element that adjusts the phase of the impedance of the receive filter 54 so as to prevent transmit signals output from the transmit filter 55 from going into the side of the receive filter 54. Moreover, an antenna 51 is connected to the phase matching circuit 53. The receive filter 54 includes a band-pass filter that transmits only signals in a predetermined frequency band, out of receive signals input via the antenna 51. Moreover, output terminals 56 are connected to the receive filter 54. The transmit filter 55 includes a band-pass filter that transmits only signals in a predetermined frequency band, out of transmit signals input via an input terminal 57. Moreover, the input terminal 57 is connected to the transmit filter 55. In this case, the receive filter 54 and the transmit filter 55 include the resonant devices according to the embodiments.

The size of the duplexer may be reduced by providing the resonant devices according to the embodiments in the receive filter 54 and the transmit filter 55 in the aforementioned manner.

3. Structure of Communication Module

Figure 23:
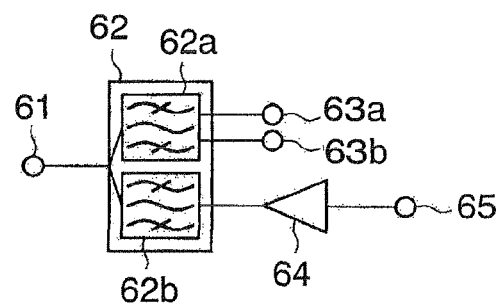
FIG. 23 is a diagram depicting an example of communication module according to an embodiment.

FIG. 23 illustrates an exemplary communication module that includes the resonant devices according to the embodiments or the duplexer illustrated in FIG. 22. A duplexer 62 includes a receive filter 62a and a transmit filter 62b, as illustrated in FIG. 23. Moreover, for example, receive terminals 63a and 63b that support balanced output are connected to the receive filter 62a. Moreover, the transmit filter 62b is connected to a transmit terminal 65 via a power amplifier 64. In this case, the receive filter 62a and the transmit filter 62b include the resonant devices according to the embodiments or the duplexer.

When a receive operation is performed, the receive filter 62a transmits only signals in a predetermined frequency band, out of receive signals input via an antenna terminal 61, to output the signals to the outside from the receive terminals 63a and 63b. Moreover, when a transmit operation is performed, the transmit filter 62b transmits only signals in a predetermined frequency band, out of transmit signals that are input from the transmit terminal 65 and amplified in the power amplifier 64, to output the signals to the outside from the antenna terminal 61.

The size of the communication module may be reduced by providing the resonant devices according to the embodiments or the duplexer in the receive filter 62a and the transmit filter 62b in the communication module in the aforementioned manner.

The structure of the communication module illustrated in FIG. 23 is an example. Even when a boundary acoustic wave device according to the present invention is included in a communication module of another type, a similar effect may be achieved.

4. Structure of Communication Device

Figure 24:
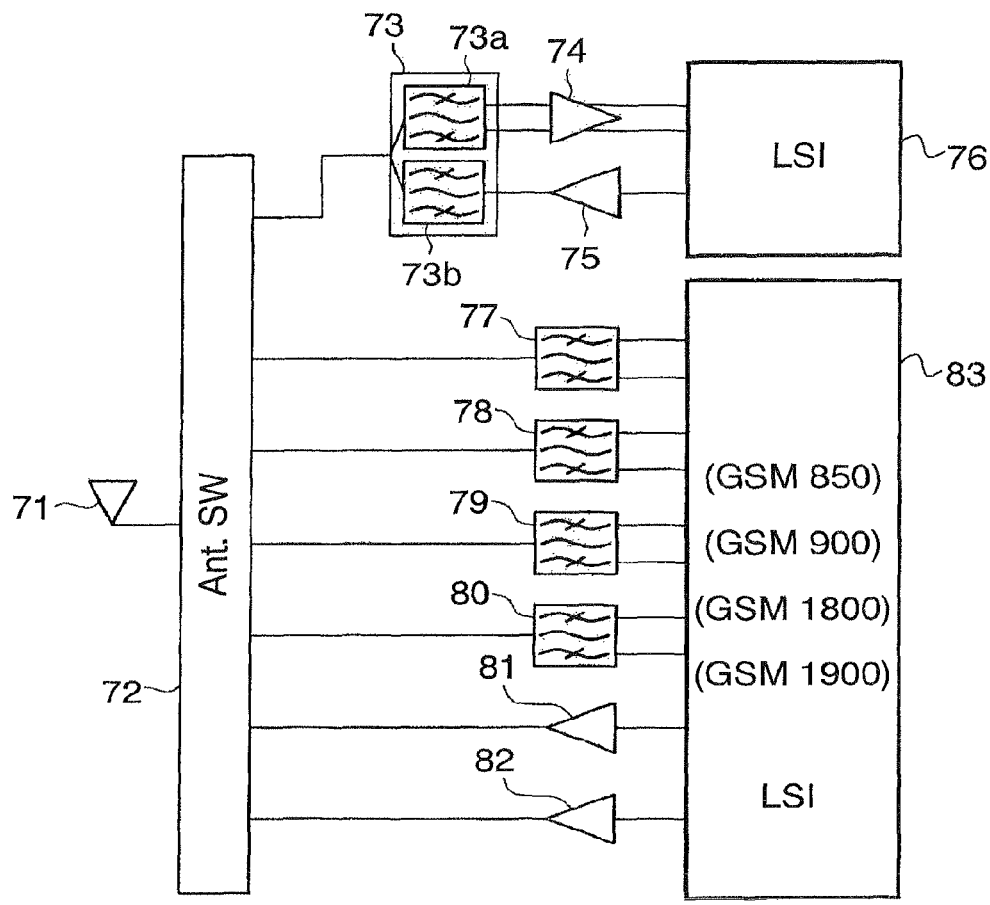
FIG. 24 is a diagram depicting an example of communication device according to an embodiment.
Figure 25:
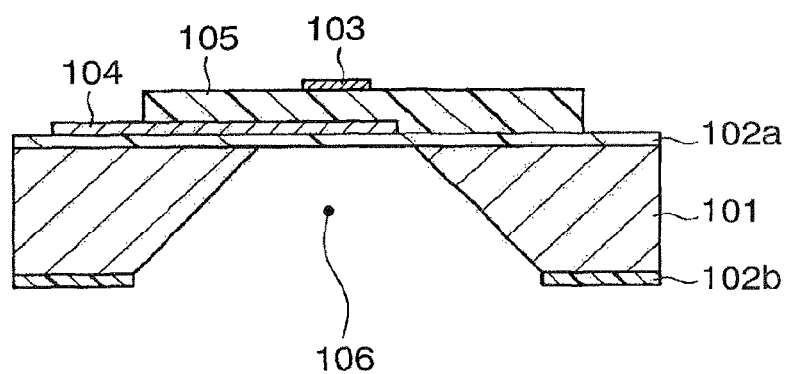
FIG. 25 is a cross sectional view depicting a schematic structure of a conventional via hole type piezoelectric thin film resonator.
Figure 26:
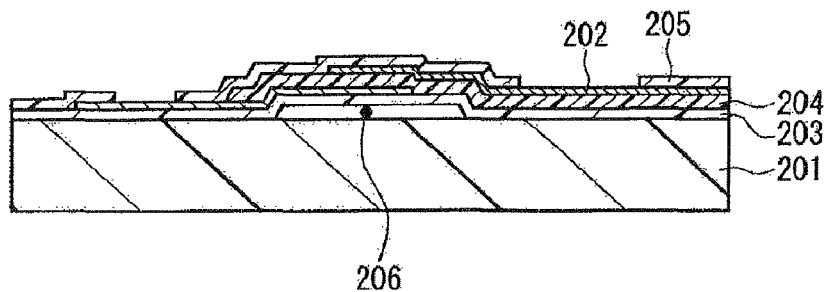
FIG. 26 is a cross sectional view depicting a schematic structure of a conventional cavity type piezoelectric thin film resonator.
Figure 27:
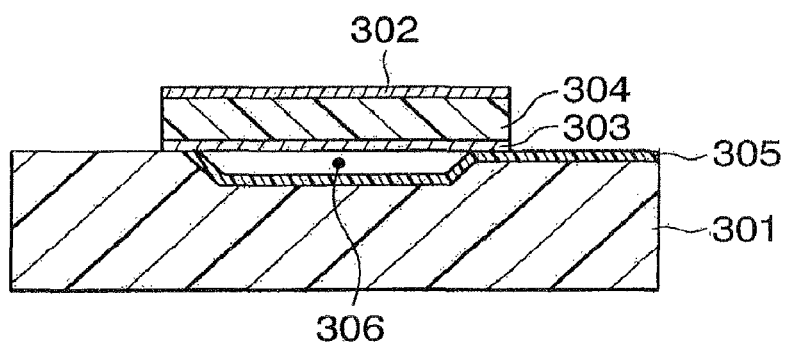
FIG. 27 is a cross sectional view depicting a schematic structure of a conventional cavity type piezoelectric thin film resonator.
Figure 28A:
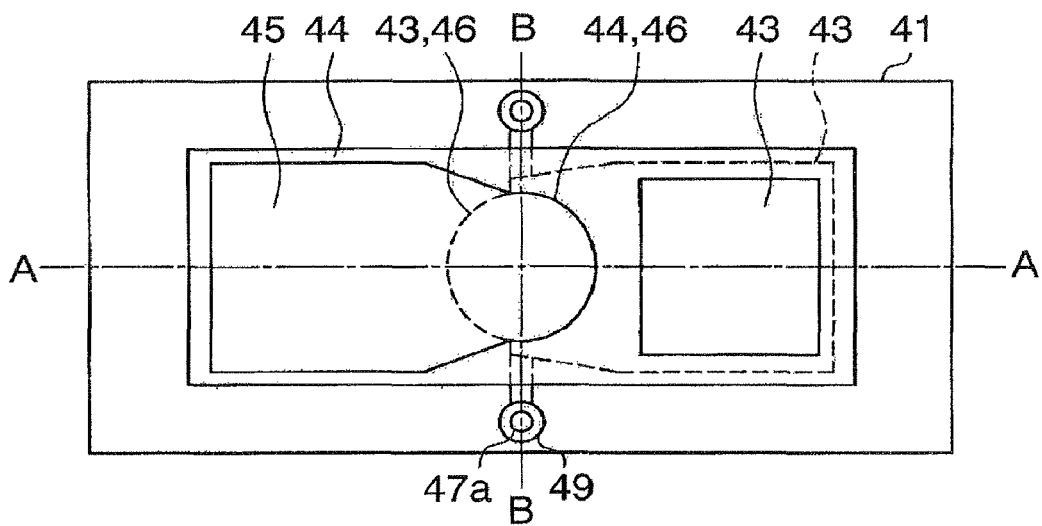
FIG. 28A is a plan view depicting a piezoelectric thin film resonator including a bulged membrane above an gap and FIG. 28B is a cross sectional view taken along line A-A in FIG. 28A.
Figure 28B:
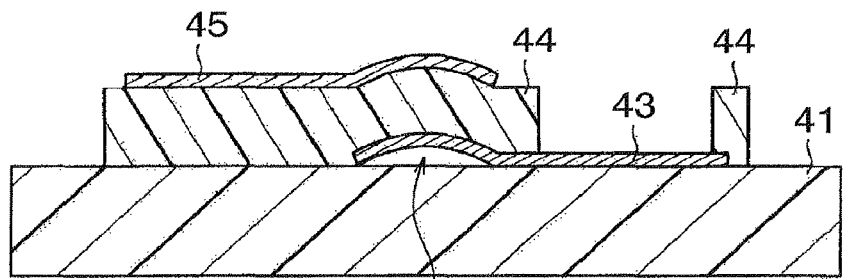
Figure 29A:
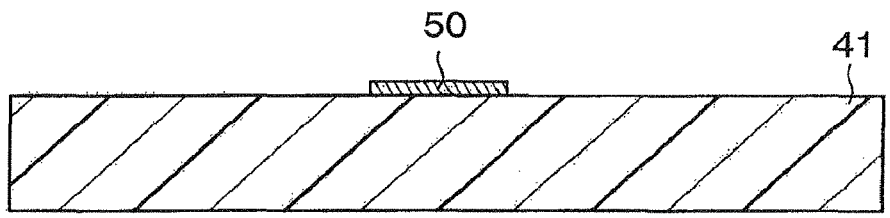
FIGS. 29A to 29C are cross sectional views depicting a process of fabricating the piezoelectric thin film resonator depicted in FIGS. 28A and 28B.
Figure 29B:
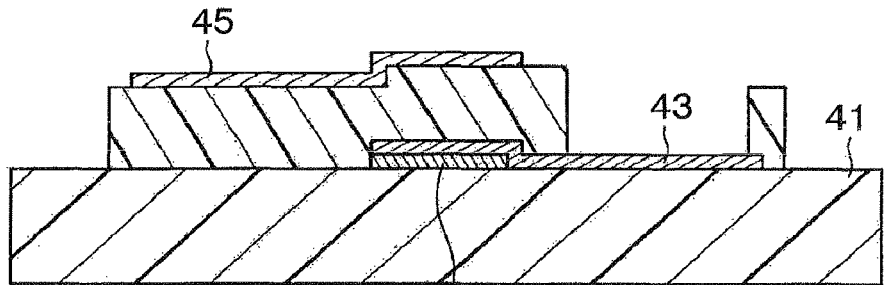
Figure 29C:
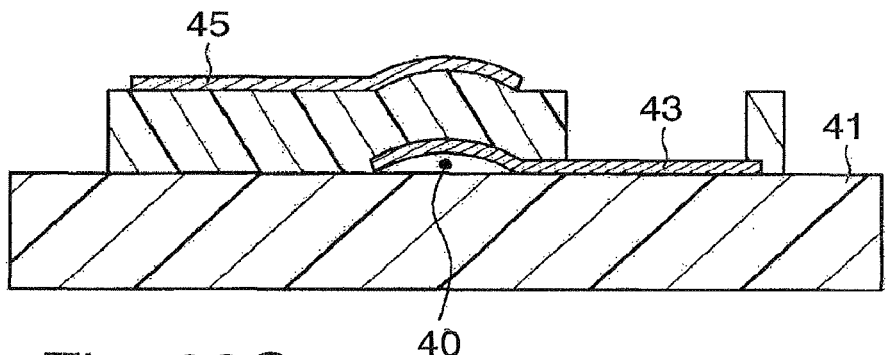

FIG. 24 illustrates an RF block of a cellular phone unit as an exemplary communication device that includes the resonant devices according to the embodiments, the duplexer, or the communication module. Moreover, FIG. 24 illustrates the structure of a cellular phone unit that supports the Global System for Mobile Communications (GSM) system and the Wideband Code Division Multiple Access (W-CDMA) system. Moreover, the GSM system in the embodiments supports the 850 MHz band, the 950 MHz band, the 1.8 GHz band, and the 1.9 GHz band. Moreover, the cellular phone unit includes, for example, a microphone, a speaker, and a liquid crystal display other than the components illustrated in FIG. 24. However, since the other components are unnecessary in the description of the embodiments, the illustration is omitted. In this case, receive filters 73a, 77, 78, 79, and 80 and a transmit filter 73b include the resonant devices according to the embodiments.

Regarding receive signals input via an antenna 71, an antenna switch circuit 72 selects an LSI to be operated in response to the communication system: W-CDMA or GSM. When the input receive signals correspond to the W-CDMA system, a switching operation is performed so as output the receive signals to a duplexer 73. The receive signals input to the duplexer 73 are limited to a predetermined frequency band by the receive filter 73a, so that the balanced receive signals are output to an LNA 74. The LNA 74 amplifies the input receive signals to output the signals to an LSI 76. For example, the LSI 76 performs demodulation of speech signals on the basis of the input receive signals and controls the operations of individual components of the cellular phone unit.

On the other hand, when signals are transmitted, the LSI 76 generates transmit signals. The generated transmit signals are amplified by a power amplifier 75 to be input to the transmit filter 73b. The transmit filter 73b transmits only signals in a predetermined frequency band, out of the input transmit signals. The transmit signals output from the transmit filter 73b are output to the outside from the antenna 71 via the antenna switch circuit 72.

Moreover, when the input receive signals correspond to the GSM system, the antenna switch circuit 72 selects one of the receive filters 77 to 80 in response to the frequency band and outputs the receive signals to the selected receive filter. The receive signals band-limited by one of the receive filters 77 to 80 are input to an LSI 83. For example, the LSI 83 performs demodulation of speech signals on the basis of the input receive signals and controls the operations of individual components of the cellular phone unit. On the other hand, when signals are transmitted, the LSI 83 generates transmit signals. The generated transmit signals are amplified by a power amplifier 81 or 82 to be output to the outside from the antenna 71 via the antenna switch circuit 72.

The size of the communication device may be reduced by providing the resonant devices according to the embodiments, the duplexer, or the communication module in the communication device in the aforementioned manner.

The structure of the communication device illustrated in FIG. 24 is just an example.

5. Effects and the Like of Embodiments

According to the embodiments, piezoelectric thin film resonators constitute a stacked structure, so that the area occupied by the piezoelectric thin film resonators on a substrate on which the piezoelectric thin film resonators are formed may be reduced, and thus the size of a resonant device may be reduced. Moreover, the sizes of a filter, a duplexer a communication module, and a communication device that include the resonant device may be reduced by reducing the size of the resonant device.

Moreover, since a membrane region of a first piezoelectric thin film resonator is physically separated from a membrane region of a second piezoelectric thin film resonator, the vibration of one of the resonators is not transmitted to the other resonator. Thus, interference between the respective vibrations of both of the resonators may be eliminated.

To achieve the effects of the present invention, the respective materials of a substrate, an electrode film, a piezoelectric film, and an insulator film are not limited to those in the embodiments, and other materials may be used.

Moreover, in the embodiments, a structure in which two resonators, a first piezoelectric thin film resonator and a second piezoelectric thin film resonator, are stacked is adopted. Even in a structure in which three resonators are stacked, effects similar to those in the embodiments may be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A resonant device comprising:
    a first piezoelectric thin film resonator including,
        a substrate,
        a first lower electrode formed on the substrate,
        a first piezoelectric film formed over the first lower electrode, and
        a first upper electrode formed on the first piezoelectric film and opposed to the first lower electrode,
    a second piezoelectric thin film resonator including,
        a second lower electrode formed above the first upper electrode,
        a second piezoelectric film formed over the second lower electrode, and
        a second upper electrode formed on the second piezoelectric film and opposed to the second lower electrode,
    wherein a first membrane region in which the first lower electrode opposes to the first upper electrode through the first piezoelectric film and a second membrane region in which the second lower electrode opposes to the second upper electrode through the second piezoelectric film are laminated through a second cavity, and
    wherein the second piezoelectric thin film resonator is mounted directly on the first piezoelectric thin film resonator with the second cavity interposed therebetween such that a portion of at least the second lower electrode of the second piezoelectric thin film resonator that is outside of the second membrane region is anchored directly on a portion of the first piezoelectric thin film resonator outside of the first membrane region.

2. The resonant device according to claim 1, wherein the second membrane region is larger than the first membrane region.

3. The resonant device according to claim 1, wherein the first piezoelectric thin film resonator includes a first etching solution inlet to remove a first sacrificial layer formed in advance to form a first cavity under the first membrane region, and the second piezoelectric thin film resonator includes a second etching solution inlet to remove a second sacrificial layer formed in advance to form the second cavity under the second membrane region, and the first etching solution inlet and the second etching solution inlet are connected.

4. The resonant device according to claim 1, wherein the second membrane region includes an opening so as to expose the first upper electrode through the opening.

5. The resonant device according to claim 4, wherein the first membrane region and the second membrane region include a first opening and a second opening, respectively.

6. The resonant device according to claim 5, wherein the first opening and the second opening are offset from each other in a longitudinal direction.

7. The resonant device according to claim 1, wherein the first piezoelectric thin film resonator and the second piezoelectric thin film resonator are electrically connected in parallel with each other.

8. The resonant device according to claim 7, wherein the second lower electrode extends to a portion opposing the first upper electrode at an outside of the first membrane region.

9. The resonant device according to claim 1, wherein the first piezoelectric thin film resonator and the second piezoelectric thin film resonator are electrically connected in series with each other.

10. The resonant device according to claim 9, wherein the second lower electrode extends to a portion opposing the first upper electrode at an outside of the first membrane region.

11. The resonant device according to claim 1, wherein the first piezoelectric film and the second piezoelectric film are made of a material including aluminum nitride as a main ingredient.

12. The resonant device according to claim 1, wherein the first membrane region and the second membrane region are elliptic.

13. The resonant device according to claim 1, wherein said portion of at least the second lower electrode of the second piezoelectric thin film resonator that is outside of the second membrane region is anchored directly on a portion of the first piezoelectric film that is exposed from the first upper electrode outside of the first membrane region.

14. The resonant device according to claim 1, wherein said portion of at least the second lower electrode of the second piezoelectric thin film resonator that is outside of the second membrane region is anchored directly on a portion of the first upper electrode outside of the first membrane region.

15. A filter comprising:
    a first piezoelectric thin film resonator including,
        a substrate,
        a first lower electrode formed on the substrate,
        a first piezoelectric film formed over the first lower electrode, and
        a first upper electrode formed on the first piezoelectric film and opposed to the first lower electrode,
    a second piezoelectric thin film resonator including,
        a second lower electrode formed above the first upper electrode,
        a second piezoelectric film formed over the second lower electrode, and
        a second upper electrode formed on the second piezoelectric film and opposed to the second lower electrode,
    wherein a first membrane region in which the first lower electrode opposes to the first upper electrode through the first piezoelectric film and a second membrane region in which the second lower electrode opposes to the second upper electrode through the second piezoelectric film are laminated through a second cavity, and
    wherein the second piezoelectric thin film resonator is mounted directly on the first piezoelectric thin film resonator with the second cavity interposed therebetween such that a portion of at least the second lower electrode of the second piezoelectric thin film resonator that is outside of the second membrane region is anchored directly on a portion of the first piezoelectric thin film resonator outside of the first membrane region.

16. A duplexer comprising:
    a first piezoelectric thin film resonator including, a substrate,
a first lower electrode formed on the substrate,
a first piezoelectric film formed over the first lower electrode, and
a first upper electrode formed on the first piezoelectric film and opposed to the first lower electrode,
a second piezoelectric thin film resonator including,
a second lower electrode formed above the first upper electrode,
a second piezoelectric film formed over the second lower electrode, and
a second upper electrode formed on the second piezoelectric film and opposed to the second lower electrode,
wherein a first membrane region in which the first lower electrode opposes to the first upper electrode through the first piezoelectric film and a second membrane region in which the second lower electrode opposes to the second upper electrode through the second piezoelectric film are laminated through a second cavity, and
wherein the second piezoelectric thin film resonator is mounted directly on the first piezoelectric thin film resonator with the second cavity interposed therebetween such that a portion of at least the second lower electrode of the second piezoelectric thin film resonator that is outside of the second membrane region is anchored directly on a portion of the first piezoelectric thin film resonator outside of the first membrane region.

17. A transmission module comprising:
a first piezoelectric thin film resonator including,
a substrate,
a first lower electrode formed on the substrate,
a first piezoelectric film formed over the first lower electrode, and
a first upper electrode formed on the first piezoelectric film and opposed to the first lower electrode,
a second piezoelectric thin film resonator including,
a second lower electrode formed above the first upper electrode,
a second piezoelectric film formed over the second lower electrode, and
a second upper electrode formed on the second piezoelectric film and opposed to the second lower electrode,
wherein a first membrane region in which the first lower electrode opposes to the first upper electrode through the first piezoelectric film and a second membrane region in which the second lower electrode opposes to the second upper electrode through the second piezoelectric film are laminated through a second cavity, and
wherein the second piezoelectric thin film resonator is mounted directly on the first piezoelectric thin film resonator with the second cavity interposed therebetween such that a portion of at least the second lower electrode of the second piezoelectric thin film resonator that is outside of the second membrane region is anchored directly on a portion of the first piezoelectric thin film resonator outside of the first membrane region.

18. A transmission device comprising:
a transmission module including,
a first piezoelectric thin film resonator including,
a substrate,
a first lower electrode formed on the substrate,
a first piezoelectric film formed over the first lower electrode, and
a first upper electrode formed on the first piezoelectric film and opposed to the first lower electrode,
a second piezoelectric thin film resonator including,
a second lower electrode formed above the first upper electrode,
a second piezoelectric film formed over the second lower electrode, and
a second upper electrode formed on the second piezoelectric film and opposed to the second lower electrode,
wherein a first membrane region in which the first lower electrode opposes to the first upper electrode through the first piezoelectric film and a second membrane region in which the second lower electrode opposes to the second upper electrode through the second piezoelectric film are laminated through a second cavity, and
wherein the second piezoelectric thin film resonator is mounted directly on the first piezoelectric thin film resonator with the second cavity interposed therebetween such that a portion of at least the second lower electrode of the second piezoelectric thin film resonator that is outside of the second membrane region is anchored directly on a portion of the first piezoelectric thin film resonator outside of the first membrane region.

19. A method for manufacturing a resonant device comprising:
forming a first sacrifice layer on a substrate;
forming a first lower electrode, a first piezoelectric film, and a first upper electrode sequentially on the first sacrifice layer and the substrate for forming a first piezoelectric thin film resonator;
forming a second sacrifice layer opposing to the first sacrifice layer through the first lower electrode, the first piezoelectric film, and the first upper electrode, wherein the second sacrifice layer is absent in at least part of a region that does not overlap the first sacrifice layer;
forming a second lower electrode, a second piezoelectric film, and a second upper electrode sequentially on the second sacrifice layer and on the first piezoelectric thin film resonator for forming a second piezoelectric thin film resonator such that a portion of at least the second lower electrode of the second piezoelectric thin film resonator that is outside of a region corresponding to the second sacrifice layer will be anchored directly on a portion of the first piezoelectric thin film resonator outside of a region corresponding to the first sacrifice layer upon removal of the first and second sacrifice layers; and
removing the first sacrifice layer and the second sacrifice layer to form respective first and second cavities, thereby forming the first and second piezoelectric thin film resonators such that the second piezoelectric thin film resonator is mounted directly on the first piezoelectric thin film resonator with the second cavity interposed therebetween.

20. A resonant device comprising:
a first piezoelectric thin film resonator including,
a substrate,
a first lower electrode formed on the substrate,
a first piezoelectric film formed over the first lower electrode, and
a first upper electrode formed on the first piezoelectric film and opposed to the first lower electrode,
a second piezoelectric thin film resonator including,
a second lower electrode formed above the first upper electrode,
a second piezoelectric film formed over the second lower electrode, and a second upper electrode formed on the second piezoelectric film and opposed to the second lower electrode, wherein a first membrane region in which the first lower electrode opposes to the first upper electrode through the first piezoelectric film and a second membrane region in which the second lower electrode opposes to the second upper electrode through the second piezoelectric film are laminated through a second cavity, wherein the first membrane region and the second membrane region include a first opening and a second opening respectively, and wherein the first opening and the second opening are offset from each other in a longitudinal direction.

21. A resonant device comprising:

a first piezoelectric thin film resonator including,
  a substrate,
  a first lower electrode formed on the substrate,
  a first piezoelectric film formed over the first lower electrode, and
  a first upper electrode formed on the first piezoelectric film and opposed to the first lower electrode, a second piezoelectric thin film resonator including,
  a second lower electrode formed above the first upper electrode,
  a second piezoelectric film formed over the second lower electrode, and
  a second upper electrode formed on the second piezoelectric film and opposed to the second lower electrode, wherein a first membrane region in which the first lower electrode opposes to the first upper electrode through the first piezoelectric film and a second membrane region in which the second lower electrode opposes to the second upper electrode through the second piezoelectric film are laminated through a second cavity, wherein the second piezoelectric thin film resonator is mounted on the first piezoelectric thin film resonator with the second cavity interposed therebetween such that a portion of at least the second lower electrode of the second piezoelectric thin film resonator that is outside of the second membrane region is anchored on a portion of the first piezoelectric thin film resonator outside of the first membrane region via an insulating layer interposed therebetween, and wherein there are no resonator support structures in the second cavity.

* * * * *